US009093644B2

(12) United States Patent
Gruhler et al.

(10) Patent No.: US 9,093,644 B2
(45) Date of Patent: Jul. 28, 2015

(54) LAYOUT SYSTEM CONSISTING OF A PIEZOACTUATOR AND A FLEXIBLE CIRCUIT BOARD AND METHOD FOR ASSEMBLING THE SAME

(71) Applicants: Holger Gruhler, Tuningen (DE); Gerd Ohmayer, Haslach (DE)

(72) Inventors: Holger Gruhler, Tuningen (DE); Gerd Ohmayer, Haslach (DE)

(73) Assignee: VEGA GRIESHABER KG, Wolfach (DE)

( * ) Notice: Subject to any disclaimer, the term of this patent is extended or adjusted under 35 U.S.C. 154(b) by 249 days.

(21) Appl. No.: 13/772,574

(22) Filed: Feb. 21, 2013

(65) Prior Publication Data
US 2014/0055007 A1    Feb. 27, 2014

Related U.S. Application Data

(60) Provisional application No. 61/616,293, filed on Mar. 27, 2012.

(30) Foreign Application Priority Data

Mar. 23, 2012  (EP) .................................... 12161026

(51) Int. Cl.
*H01L 41/09* (2006.01)
*H01L 41/31* (2013.01)
(Continued)

(52) U.S. Cl.
CPC . *H01L 41/31* (2013.01); *B06B 1/06* (2013.01); *G10K 11/004* (2013.01); *H01L 41/0475* (2013.01); *H01L 41/0825* (2013.01); *H01L 41/29* (2013.01); *Y10T 29/42* (2015.01)

(58) Field of Classification Search
CPC ........... H01L 2924/01079; H01L 2924/01078; H01L 2924/01029; H01L 2924/15311; H01L 2224/16; H01L 23/49827; H05K 2201/096; H05K 2201/0355; H05K 3/4069; H05K 3/4602; H05K 3/429; H05K 3/115; H05K 3/112; H05K 3/4029
USPC .......... 310/311, 328, 334, 365; 174/260, 264, 174/266; 361/768
See application file for complete search history.

(56) References Cited

U.S. PATENT DOCUMENTS 3,518,752 A  *  7/1970  Lentz ........................... 29/592.1
6,308,389 B1    10/2001  Tezuka
(Continued)

FOREIGN PATENT DOCUMENTS

WO    WO 2011/139602       11/2011
WO    WO2011139602 A2 *   11/2011   .............. H01L 41/08

OTHER PUBLICATIONS

EP Office Action, Appln. No. 12161026.5 mailed Jul. 27, 2012, 6 pages—German, 3 pages—English.
(Continued)

*Primary Examiner* — Thomas Dougherty
(74) *Attorney, Agent, or Firm* — Andrew F. Young, Esq.; Lackenbach Siegel, LLP

(57) ABSTRACT

A layout arrangement and system consisting of a piezoactuator and a flexible circuit board, with at least one electrical and mechanical connection, produced by an electrically conducting adhesive, between a first connection contact on the circuit board and a second connection contact on the piezoactuator, wherein the connection is led through an opening in the flexible circuit board and wherein the surfaces of the connection contacts that are glued together have an essentially parallel and equally oriented normal vector, and a method for assembling and arranging the same.

11 Claims, 6 Drawing Sheets

(51) Int. Cl.
*H01L 41/047* (2006.01)
*H01L 41/08* (2006.01)
*G10K 11/00* (2006.01)
*B06B 1/06* (2006.01)
*H01L 41/29* (2013.01)

(56) References Cited

U.S. PATENT DOCUMENTS 6,472,610 B1 * 10/2002 Kawabata .................. 174/260
8,872,412 B2 * 10/2014 Tezuka et al. ................ 310/334
2006/0238067 A1 10/2006 Dausch
2009/0001853 A1 1/2009 Adachi et al.
2010/0067151 A1 * 3/2010 Okawara et al. .............. 360/294
2010/0271735 A1 * 10/2010 Schreiber .................... 360/290

OTHER PUBLICATIONS

PCT/US2011/033579 International Search Report and Written Opinion, mailed Dec. 13, 2011, 8 pages.

* cited by examiner

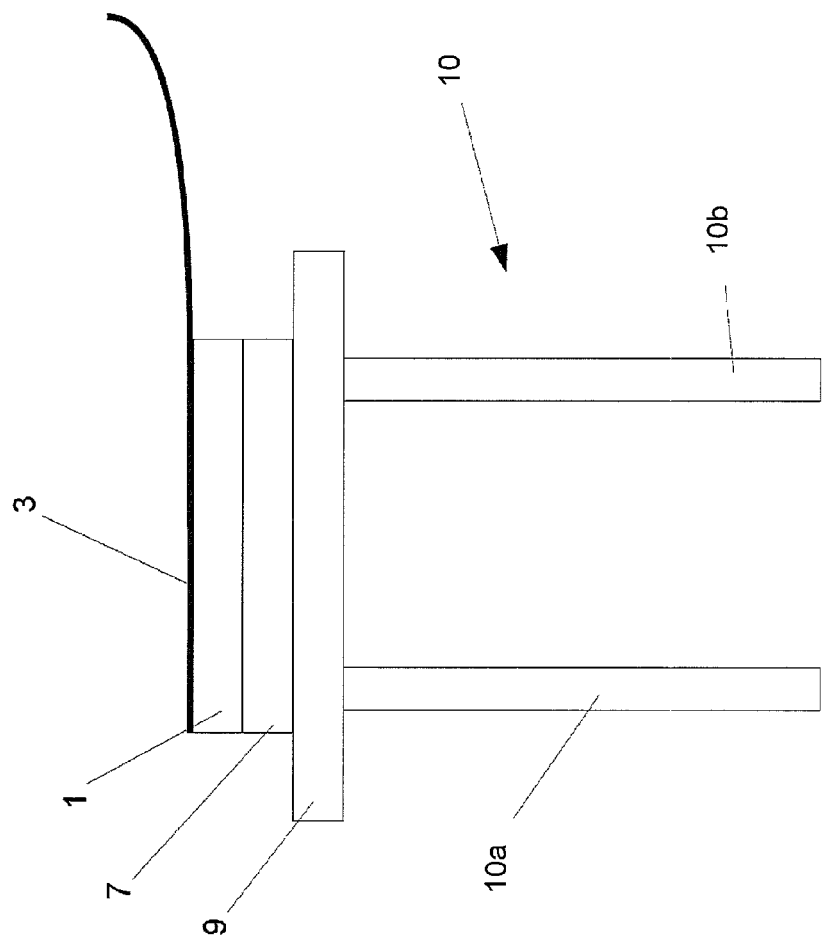

LAYOUT SYSTEM CONSISTING OF A PIEZOACTUATOR AND A FLEXIBLE CIRCUIT BOARD AND METHOD FOR ASSEMBLING THE SAME

CROSS-REFERENCE

This application relates to and claims priority from U.S. Provisional Ser. No. 61/616,293 filed Mar. 27, 2012, and European Application Serial No. EP 12 161 026.5 filed Mar. 23, 2013, the entire contents of each of which are incorporated herein by reference.

BACKGROUND OF THE INVENTION

1. Field of the Invention

The present invention relates to layout system consisting of a piezoactuator and a flexible circuit board, with at least one electrical and mechanical connection, produced by an electrically conducting adhesive, between a first connection contact on the flexible circuit board and a second connection contact on the piezoactuator, wherein the connection is led through an opening in the flexible circuit board and wherein the surfaces of the connection contacts that are glued together have an essentially parallel and equally oriented normal vector. Additionally, the present invention provides a method for assembling a piezoactuator and flexible circuit board to provide such a layout.

2. Description of the Related Art

Industrial applications of layouts exist in which an electrical and mechanical connection is produced by a glue connection between a flexible circuit board and a piezoactuator. These are known from the prior art and are used, for example, in so-called vibration level meters.

The schematic construction of such a vibration level meter is generally shown in FIG. 6.

The schematic construction in FIG. 6 is neither true to scale nor complete and should only represent a kind of basic diagram of the functioning of a vibration level meter.

The depicted vibration level meter has a tuning fork 10, which is arranged on a membrane 9. The membrane 9 is part of the tuning fork 10, wherein prongs 10a, 10b of the tuning fork 10 are joined directly to the membrane 9 and move toward and away from each other by bending of the membrane 9.

The membrane 9 is generally made from refined steel and can be set in vibration by a piezoactuator 1. The piezoactuator 1 is joined to the membrane 9 via a ceramic tile 7, which is provided between the piezoactuator 1 and the membrane 9. The ceramic tile 7 is provided to adapt the different thermal coefficients of expansion of the membrane 9 and the piezoactuator 1 to each other.

An excitation of the piezoactuator 1 occurs via an electrical voltage, which is applied by a flexible circuit board 3 to the top side of the piezoactuator 1. A bottom side of the piezoactuator 1 is metallized throughout, so that a voltage applied to the top side produces a vibration of the piezoactuator 1 by virtue of a segmentation of the electrode on the top side and a different polarization of these piezosegments. The flexible circuit board 3 in the present example is configured as a so-called flex line, i.e., a flexible springlike circuit board with conductor tracks arranged on it.

The flexible circuit board 3 is joined to the piezoactuator 1 at its contact points by a conducting adhesive, so that a voltage is introduced into the piezoactuator 1 only at the points joined by the adhesive. The piezoactuator 1 as well as the ceramic tile 7 and the membrane 9 are also glued together.

In order to generate a vibration of the tuning fork 10 with the piezoactuator 1 and at the same time detect a frequency shift or attenuation of the tuning fork 10, the piezoactuator 1 is divided into four segments. The piezoactuator 1 is generally round in top view and divided into four quadrants, which can be individually actuated by applying a voltage. To create a voltage, each time two diagonally opposite quadrants are subjected to a voltage, while the other two quadrants are used to detect the resulting vibration. In this way, a vibration can be excited and detected at the same time.

In most of the customary layouts of the related art with a piezoactuator 1 and a circuit board 3, the circuit board 3 is provided with a first connection contact 11 for the applying of the voltage, which is arranged corresponding to a second connection contact 12 on the piezoactuator 1. For this, the first connection contact 11 on the circuit board 3 is generally arranged on the side of the flexible circuit board 3 facing the piezoactuator 1, so that an electrically conducting connection can be produced between the first connection contact 11 and the second connection contact 12 by applying a conducting glue and pressing the two parts together.

Because of the slight gluing surface and the subsequent pressing together, a quantity of adhesive must be measured out that is very small and very precise, or else there is a chance of shorting circuits to the adjoining quadrants of the piezoactuator 1 due to running of glue or squeezing out during the pressing. An exactly reproducible dispensing of a very small quantity of a highly viscous medium can only be done with difficulty, due to the surface forces and temperature dependence prevailing in the case of small volumes, so that a higher production cost is the result.

Furthermore, it is a problem with this procedure that a wrong orientation of the flexible circuit board 3 at the outset can no longer be corrected, since the conductive glue between the connection contacts 11, 12 will become smeared and again there is a chance of short circuits between the individual quadrants of the piezoactuator 1 or the correspondingly arranged contacts of the flexible circuit board 3. Furthermore, it is a negative that the flexible circuit board 3 and the piezoactuator 1 cannot be arranged one on top of the other, due to the glue connection 5 in between. Another negative is that when the flexible circuit board 3 and the piezoactuator 1 are pressed together the glue connections located between them are pressed flat and thus any excess glue is forced out sideways next to the connection contacts 11, 12. This increases the risk of short circuits.

Because of the purely material connection between flexible circuit board 3 and piezoactuator 1, any later loading of the glue connection must be absorbed by cohesion and adhesion forces. Thus, a mechanical loading of the glue connection is also only extremely slight.

After depositing the adhesive, the flexible circuit board 3 must be positioned plane parallel and exactly with respect to the piezoactuator 1. For the above-presented reasons, a position correction afterwards is not possible.

There are approaches in which the flexible circuit board 3 is provided with a first opening in the area of the connection contacts 11, 12, through which excess glue can escape. In these layouts, however, there is still the drawback that the adhesive is first placed on the piezoactuator 1 and then the flexible circuit board 3 is pressed together with it, so that a subsequent correction of the orientation of the flexible circuit board 3 relative to the piezoactuator 1 is not possible. Furthermore, it was discovered that, due to the low gap height of the adhesive used in the gap between the flexible circuit board 3 and the piezoactuator 1, large capillary forces prevail, by which the adhesive is also sucked out between piezoactuator 1 and flexible circuit board 3 across the connection contacts provided. Such a spreading of the electrically conducting adhesive between the piezoactuator and the flexible circuit board is encouraged by minimal unevenness or a minimal deviation from parallel of flexible circuit board and piezoactuator. As pointed out above, this effect leads to short circuits, resulting in a defective overall level meter layout.

The problem of the present invention is to eliminate the above-described drawbacks and provide an improved layout system, as well as an improved process control, as well as an improved method for assembling and manufacturing the same.

Accordingly, there is a need improvements that overcome the noted concerns above. Further, there is also a need to improve process efficiencies.

ASPECTS AND SUMMARY OF THE INVENTION

In response, it is now recognized that the proposed invention solves at least one of the above noted concerns.

These problems are solved by a layout system or arrangement according to disclosure, providing of an installation aid according to disclosure, and providing for a method for fabrication and assembly of such a layout A layout according to the invention consisting of a piezoactuator 1 and a flexible circuit board has at least one electrical and mechanical connection, produced by an electrically conducting adhesive, between a first connection contact on the circuit board and a second connection contact on the piezoactuator, wherein the connection is led through an opening in the flexible circuit board and wherein the surfaces of the connection contacts that are glued together have an essentially parallel and equally oriented normal vector and the second connection contact consists of a thin-film electrode and at least one thick-film electrode.

In a layout according to the invention, there is created in this way a rivet-like glue connection, wherein the connection contacts on the piezoactuator are oriented to the flexible circuit board in the same direction. Because a non-shape-limited opening is provided in the flexible circuit board, through which the electrically conducting adhesive can be introduced for the gluing, while at the same time it covers the edges of the opening at the side of the flexible circuit board pointing away from the piezoactuator, there is produced a mushroom or rivet-shaped glue connection, which has a significantly increased mechanical stability as compared to pure contact gluing. Thanks to the use of a thin-film electrode and a thick-film electrode, moreover, an increased application of force is achieved during a pressing together of the flexible circuit board with the piezoactuator prior to the introducing of the electrically conductive adhesive and one edge of the thick-film electrode, which accomplishes a sealing effect between the piezoactuator and the flexible circuit board. In this way, the invention prevents the electrically conductive adhesive from spreading through capillary forces past the edge of the thick-film electrode between the piezoactuator and the flexible circuit board and causing short circuits.

An especially simple layout can be achieved when the thick-film electrode is arranged on the thin-film electrode according to one aspect of the present invention.

As an alternative embodiment, a thin-film electrode, applied by thin-film techniques, such as a copper nickel electrode with a film thickness of less than 1 μm, can be deposited for example by chemical gas-phase deposition or physical gas-phase deposition, such as vapor deposition or cathode sputtering, full-surface, selectively, or in a lift-off process. A full-surface, bounded as exactly as possible, and reproducible metallization by the thin-film electrode is necessary in order to apply voltage as fully as possible to the surface of the piezoactuator or individual quadrants of the piezoactuator.

On the thin-film electrode a thick-film electrode can then be placed, such as a silver thick film with a film thickness of more than 10 μm. The thick-film electrode can be applied, for example, by a silk screen method and subsequently hardened.

Alternatively, and if necessary for process technology reasons, such as a thermally sensitive thin-film electrode, the thick-film electrode can also be deposited first on the piezoactuator and hardened, and then the thin-film electrode applied for the full-surface voltage feed.

In order to assure the fullest surface current feed in the piezoactuator and at the same time achieve a high safety against short circuits, it is advisable for the thick-film electrode to have a smaller surface that the thin-film electrode. In this way, the electrically conductive adhesive is used only in the region of the smaller surface of the thick-film electrode and the current feed to the piezoactuator occurs via the additionally deposited thin-film electrode.

According to another alternative aspect of the present invention there is provided an especially simple and symmetrical configuration is achieved when the thick-film electrode is circular in shape. Thanks to a circular configuration of the thick-film electrode, a closed outer edge of the thick-film electrode can be achieved especially easily, not being interrupted by corner segments, as would be present for example in rectangular thick-film electrodes.

Alternatively, the thick-film electrode can also be shaped as a ring, in this case the advantage being that the annular thick-film electrode additionally creates a kind of "tub" or "bordering" for the electrically conductive adhesive. It will be recognized that the thick-film electrode, and indeed the thin-film electrode can be shaped in alternative geometric regular and irregular shapes without departing from the scope and spirit of the present invention.

In order to achieve the aforementioned sealing effect, it is advisable for the thick-film electrode to have a first diameter that is larger than a diameter of the opening in the flexible circuit board. In this way, the flexible circuit board lies fully on the edge of the thick-film electrode and thus creates an encircling sealing edge. The first diameter of the thick-film electrode and the diameter of the opening in the flexible circuit board are preferably attuned to each other so that a sufficient glue surface is created for a mechanical connection between the flexible circuit board and the piezoactuator and at the same time a good sealing effect is achieved.

In order to achieve a uniform pressing force and thus the same sealing effect all around, it is further alternatively advisable for the thick-film electrode and the opening in the flexible circuit board to be oriented concentrically to each other.

In order to achieve a further limitation of the expansion of the electrically conductive adhesive between the flexible circuit board and the piezoactuator, it is furthermore possible to provide a circular and an annular thick-film electrode. In this way, on the one hand, a good mechanical connection is achieved in the region of the circular thick-film electrode and a kind of "trench" is created between the circular thick-film electrode and the annular thick-film electrode, in which excess electrically conductive adhesive that is expanding by virtue of capillary forces can collect without otherwise troubling the proper functioning of the system.

The above described layout can be produced especially easily with an installation aid, wherein the installation aid is essentially plate shaped and has at least one second opening in the region of the at least one connection, while a second diameter of the second opening in the installation aid and a first diameter of the thick-film electrode are adapted to each other such that a force pointing in the direction of the layout and acting on the flexible circuit board will act on an edge of the thick-film electrode so that a seal is produced relative to the adhesive.

By an adapting of the second diameter of the second opening provided in the installation aid to the first diameter of the thick-film electrode so that a pressure is exerted on the flexible circuit board so that a maximum force and thus a sealing effect is achieved on the circumferential edge of the film electrode, an especially reliable fabrication of the above-described layout is made possible.

For the fabrication of the above-described layout, in a first step the flexible circuit board and the piezoactuator are arranged relative to each other, the installation aid is oriented relative to the flexible circuit board, the flexible circuit board and the piezoactuator are pressed together by means of the installation aid, the electrically conductive adhesive is introduced into at least a first opening of the flexible circuit board and hardened.

An orienting arrangement of the flexible circuit board and the piezoactuator means in this context that openings provided in the flexible circuit board are oriented as concentrically as possible to the thick-film electrodes provided on the piezoactuator. Likewise, the installation aid is arranged so that the openings in the installation aid are oriented as concentrically as possible to the openings in the flexible circuit board and thus concentrically to the thick-film electrode situated underneath on the piezoactuator. By an adapting of the diameter (or alternatively any selected opening shape regular or irregular of any kind, without limitation, including rectangular, ovoidal, arcuate, pyramidal, etc.) of the openings in the installation aid to the diameter of the thick-film electrodes, during the pressing together the flexible circuit board is pressed down at a certain distance from the edge of the thick-film electrode so that a sealing effect is achieved at the edge of the thick-film electrode with respect to the electrically conductive adhesive introduced there.

A preferred diameter for the thick-film electrode is 2.5 mm, while the diameter for the second opening in the installation aid is then preferably 3.2 mm. While these numbers are expressed as diameters (suggesting circular), it is understood that these may also be dimensions of any regular or irregular opening shape.

The present invention will be explained in detail hereafter by means of exemplary sample embodiments, making reference to the enclosed figures.

The above and other aspects, features and advantages of the present invention will become apparent from the following description read in conjunction with the accompanying drawings, in which like reference numerals designate the same elements.

BRIEF DESCRIPTION OF THE DRAWINGS

FIG. 6 is an exemplary a level meter layout in accordance to this application.

DETAILED DESCRIPTION OF THE PREFERRED EMBODIMENTS

Figure 1:
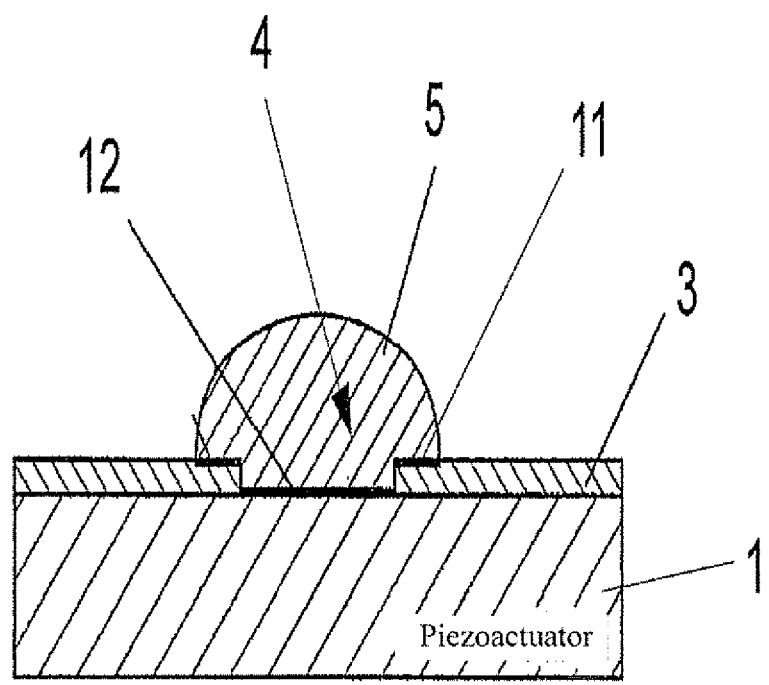
FIG. 1 is a layout according to the prior art.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

FIG. 1 shows a layout composed of a piezoactuator 1, on which a flexible circuit board 3 is arranged, wherein an electrical and mechanical connection is produced by an electrically conducting adhesive between the flexible circuit board 3 and the piezoactuator 1. The electrically conductive adhesive joins a first connection contact 11, which is arranged in ring shape on the side of the flexible circuit board 3 away from the piezoactuator 1, surrounding in ring fashion a first opening 4 in the flexible circuit board 3. A second connection contact 12 is arranged on the piezoactuator 1 toward the flexible circuit board 3 and configured as a circle.

Due to fine irregularities in the piezoactuator 1 or the flexible circuit board 3, tiny interstices are formed between these components, whereby large capillary forces suck the highly viscous electrically conducting adhesive into the interstices. Since the surface properties in this area can only be further improved with difficulty, it is practically impossible to avoid the capillary effect, so that in this layout an average probability of malfunction caused by short circuit was determined at around 19% or higher.

Figure 2:
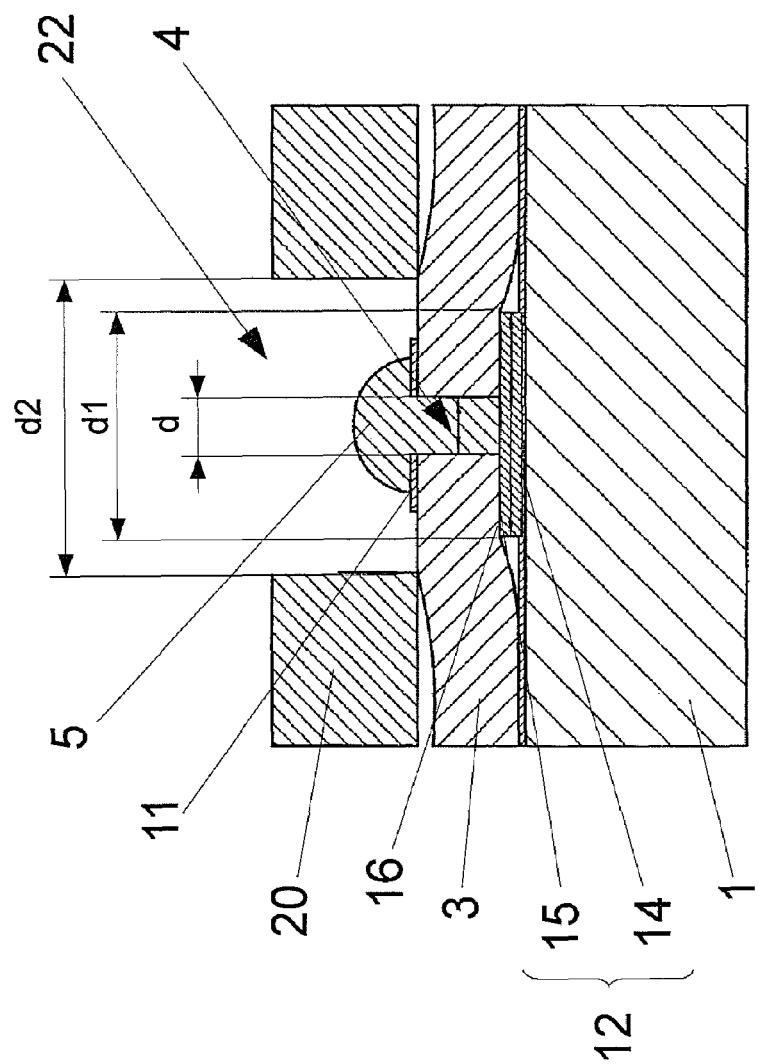
FIG. 2 is a first sample embodiment in the installation position in accordance to this application.

FIG. 2 shows a layout according to the invention, in which the second connection contact 12 is formed by a thin-film electrode 14 and a thick-film electrode 15 arranged on the thin film 14. The thin-film electrode 14 serves for approximately full-surface electrical contacting of the piezoactuator 1, wherein the thick-film electrode 15 is arranged essentially in a region underneath the first opening 4 in the flexible circuit board 3. A first diameter d1 of the thick-film electrode 15 is somewhat larger in this region than a diameter d of the opening 4 by which the electrically conducting adhesive is inserted to produce the electrical and mechanical connection 5. FIG. 2, moreover, shows an installation aid 20, which is used during an assembly or there after when producing the layout of the invention.

The installation aid is basically plate-shaped and has second openings 22 corresponding to the openings 4 in the flexible circuit board 3. A second diameter d2 of the second openings 22 is chosen somewhat larger than the first diameter d1 of the thick-film electrode 15, so that by pressing together the components during the installation a slight bending of the flexible circuit board 3 occurs and a sealing effect is achieved in a circumferential edge 16 of the thick-film electrode 15 for an electrically conducting adhesive introduced after the pressing. There are small illustrative-only dots depicted by sealing edges 16 to denote the stress concentration applied, however the stress and pressure applied is not limited and follows the stress factors applied to aid in a sealing effect as discussed herein. Necessarily, the geometric arrangement of the elements in the proposed system impact the stress concentrations thereof and serve as stress concentrators thereof to enable the goals of the proposed invention.

The second diameter d2 of the second opening 22 in the installation aid 20 is not-limited to a particular shape or dimension but is preferably 28% larger than the first diameter d1 of the thick-film electrode 15. In a specific sample embodiment, the first diameter d1 of the thick-film electrode 15 is 2.5 mm and the second d2 of the second opening 22 in the installation aid 20 is 3.2 mm. The diameter d of the opening 4 in the flexible circuit board 3 is 1.2 mm in this sample embodiment.

Figure 3:
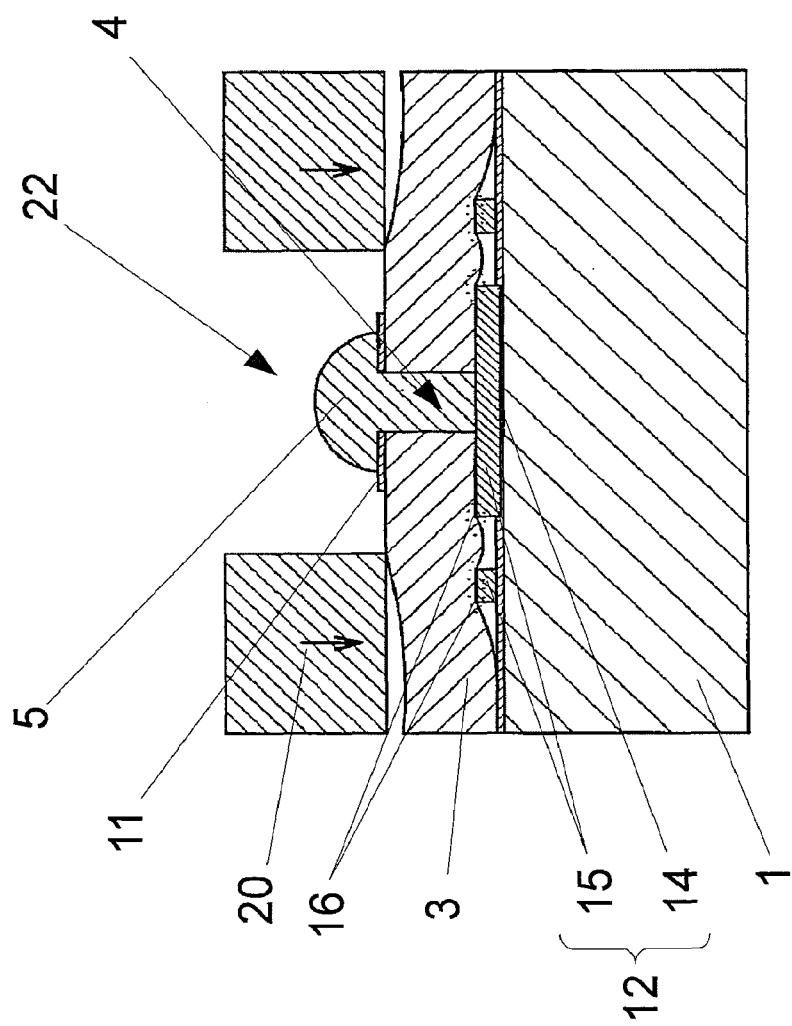
FIG. 3 is a second sample embodiment in the installation position in accordance to this application.

FIG. 3 shows another sample embodiment of the layout according to the invention, as well as the installation aid 20.

In contrast with FIG. 2, the thick-film electrode 15 in the present sample embodiment is two-piece, with a first piece, similar to FIG. 2, being fashioned as a circle immediately beneath the opening 4 in the flexible circuit board 3. In addition to the circular piece of the thick-film electrode 15 there is provided a ring-shaped segment, which is arranged at a distance from and surrounding the circular thick-film electrode 15. Thanks to this configuration of the thick-film electrode 15, on the one hand a sealing effect is achieved when pressing together the installation aid 20 with the flexible circuit board 3 and the piezoactuator 1 at the circumferential edge 16 of the circular thick-film electrode 15, which occurs likewise at the interior and exterior circumferential edges of the circular thick-film electrode 15. Furthermore, by spacing apart the annular thick-film electrode 15 from the circular thick-film electrode 15 a kind of "trench" is created, in which excess electrically conducting adhesive can collect. This "trench" is bounded at the outside by the annular thick-film electrode, so that short circuits due to further spreading of the electrically conducting adhesive can be effectively avoided.

Figure 4:
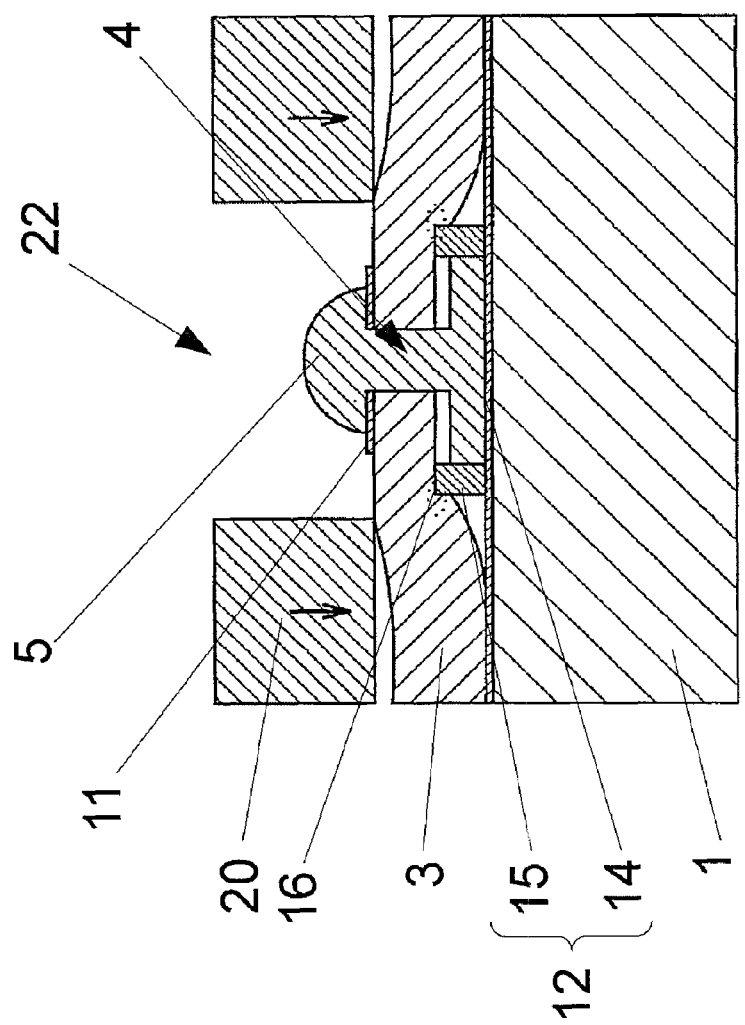
FIG. 4 is a third sample embodiment in the installation position in accordance to this application.

FIG. 4 shows another alternative sample embodiment of the layout according to the invention.

In the sample embodiment shown in FIG. 4, only one annular thick-film electrode 15 is provided, which in the installed state enables, on the one hand, an increased sealing effect at its circumferential edge 16, and at the same time forms a kind of "tub" inside the ring for the electrically conducting adhesive 5 introduced through the opening 4 in the flexible circuit board 3. It will be further understood by those of skill in the art that the "tub" is the application of stress concentration in a boundary region, e.g., a non-geometrically limited boundary element to provide a sealing effect. While preferably generally circular, there is no limitation on the geometric shape for the edge 16, and it need not be in the shape shown. It will be further understood, that while edge 16, etc. or even thick film electrode 15 are shown in cross-section as generally rectangular, alternative cross-sections are included, particularly those with a flat bottom surface (for contacting 14, but an arcuate, rounded, or other shaped top surface may be created without departing from the scope of the present invention.

Figure 5:
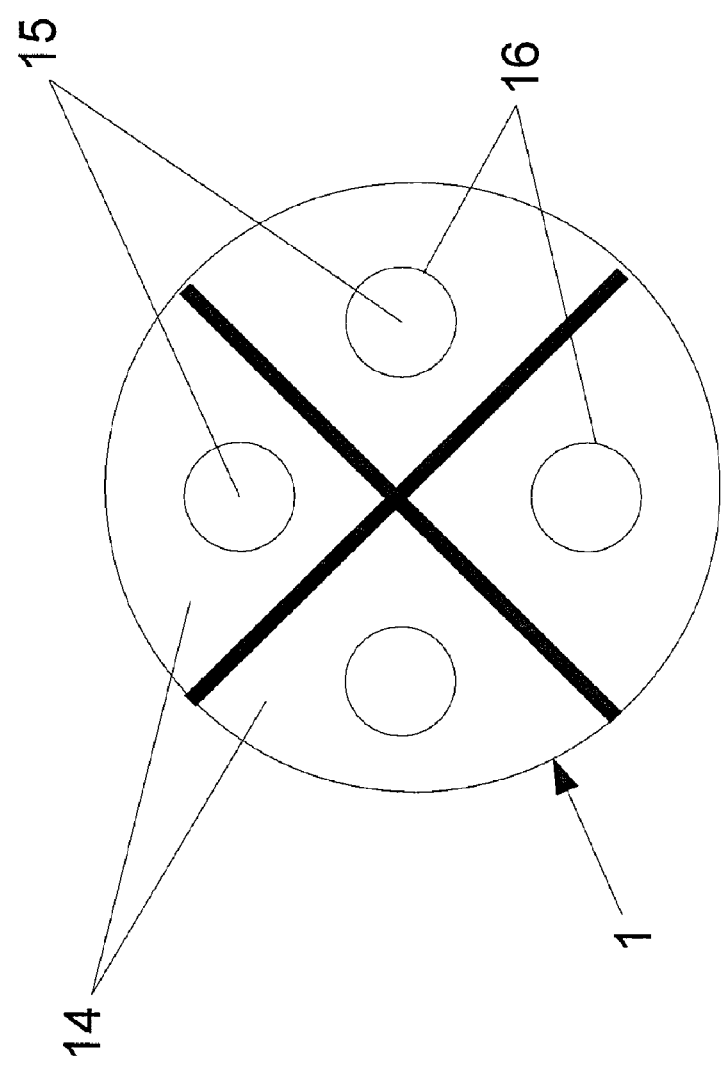
FIG. 5 is top view of an example piezoactuator in accordance to this application.

FIG. 5 shows the piezoactuator 1 from FIG. 2 in top view, where the piezoactuator 1 is divided into four segments, as is customary to realize a driving mechanism for a level meter appliance. The four segments are each fully covered by the thin-film electrode 14, but have a sufficient spacing from each other to guarantee an insulation of the segments against each other. In a central area of the thin-film electrodes 14 there is arranged in each segment a circular thick-film electrode 15, bounded by a circumferential edge 16. The circumferential edge 16 guarantees an improved sealing effect against the electrically conducting adhesive during the installation of the layout of the invention, so that with the layout shown in FIGS. 2 and 5 it was possible to achieve a reduction in short circuit-related malfunctions from 19% to 3%—as indicated above. By increasing the pressing force during the installation process, it was even possible to reduce the short circuit-related malfunction rate to 0%.

The installation of the layouts of the invention occurs with the following steps:

In a first step, the thin-film electrode 14 and the thick-film electrode 15 are placed in suitable size on the piezoactuator 1. As a rule, the thin-film electrode 14 is placed almost fully on the surface of the segments of the piezoactuator 1 by chemical or physical gas-phase deposition. The thick-film electrodes 15 are then applied—or, if the process control so requires, prior to the thin-film electrode 14—in circular shape in a central region of the individual segments of the piezoactuator 1, for example, by a silk screen method, and hardened.

The final structurized piezoactuator 1 and the flexible circuit board 3 are then oriented relative to each other. Since the flexible circuit board 3 has openings 4 arranged corresponding to the thick-film electrodes 15, an orienting of flexible circuit board 3 and piezoactuator 1 relative to each other means that the openings 4 are arranged above the respective thick-film electrodes 15. The piezoactuator 1 and flexible circuit board 3 oriented relative to each other are oriented relative to the installation aid 20 for the installation, i.e., the openings 4 provided in the flexible circuit board 3 are oriented concentrically to the second openings 22 in the installation aid 20. Depending on how the process is organized, an orienting of flexible circuit board 3 and piezoactuator 1 can also be done with the help of a permanently mounted installation aid 20.

Once all elements are correctly oriented relative to each other, a force suitably dimensioned to achieve the sealing effect at the circumferential edge 16 is applied by means of the installation aid 20 in the direction of the piezoactuator 1 and then—possibly after a further check for correct orientation of the individual components—a predetermined quantity of a conductive adhesive is introduced into the opening 4 of the flexible circuit board 3.

The predetermined quantity of conducting adhesive is dimensioned such that the first connection contact 11, which surrounds the opening 4 in the flexible circuit board 3 in the shape of a ring, is at least partly covered in dome fashion, so that a mushroom and rivet-shaped glue connection results, which at the same time produces the electrical connection between the first connection contact 11 and the second connection contact 12. After a hardening of the electrical and mechanical connection 5 or the electrically conductive adhesive used, the force used for the pressing can be relaxed and the installation aid 20 removed. Then the components that are firmly mechanically and electrically joined together (piezoactuator 1 and flexible circuit board 3) can be inserted into the layout of FIG. 6 for further use.

LIST OF REFERENCE NUMBERS 1 piezoactuator
3 flexible circuit board 4 first opening
5 electrical and mechanical connection
7 ceramic tile
9 membrane
10 tuning fork
10a prongs
10b prongs
11 first connection contact
12 second connection contact
14 thin-film electrode
15 thick-film electrode
16 edge
20 installation aid
22 second opening
d1 first diameter
d2 second diameter
d diameter Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A layout system, including a piezoactuator and a flexible circuit board, comprising:
   a piezoactuator;
   a flexible circuit board on said piezoactuator;
   a first connection contact on said circuit board and a second connection contact on said piezoactuator;
   an opening in said flexible circuit board proximate said first and said second connection contacts;
   an adhesive electrical and mechanical connection between said first and said second connection contacts;
   at least a portion of surfaces of each said first and said second connection being essentially in a parallel orientation together along a designated normal vector; and
   said second connection contact further comprises:
   at least one thin-film electrode; and
   at least one thick-film electrode.

2. A layout system, according to claim 1, wherein:
said thick-film electrode is arranged on said thin-film electrode.

3. A layout system, according to claim 2, wherein:
said thick-film electrode has a surface area less than a surface are of said thin-film electrode.

4. A layout system, according to claim 1, wherein:
said thick-film electrode is one of circular shape and an annular shape.

5. A layout system, according to claim 1, wherein:
said thick-film electrode has a first dimension d1 that is larger than a dimension d of said opening in said flexible circuit board.

6. A layout system, according to claim 5, wherein:
said thick-film electrode is one of circular in shape and annular in shape; and
said thick-film electrode having said one of said shape is arranged concentrically oriented with said opening in said flexible circuit board.

7. A layout system, according to claim 1, wherein:
said thick-film electrode has an opening proximate said opening in said flexible circuit board.

8. A layout system, according to claim 7, wherein:
said opening of said thick-film electrode has a first dimension that is greater than a second dimension of said opening in said flexible circuit board.

9. A layout system, according to claim 1, further comprising:
an installation aid having a substantially planar bottom contact surface; and
an opening in said installation aid proximate said adhesive electrical and mechanical connection.

10. A layout system, according to claim 9, wherein:
said opening in said installation aid dimensioned to apply operative urging force on an outer boundary of said thick-film electrode during an assembly therewith.

11. A layout system, according to claim 10, wherein:
said opening in said installation aid being one of greater in dimension than a dimension of said thick-film electrode and lesser in dimension than said dimension of said thick-film electrode.

* * * * *